(12) United States Patent
Makosiej

(10) Patent No.: US 10,839,906 B2
(45) Date of Patent: Nov. 17, 2020

(54) IN MEMORY COMPUTING (IMC) MEMORY CIRCUIT HAVING 6T CELLS

(71) Applicant: COMMISSARIAT A L'ENERGIE ATOMIQUE ET AUX ENERGIES ALTERNATIVES, Paris (FR)

(72) Inventor: Adam Makosiej, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/588,140

(22) Filed: Sep. 30, 2019

(65) Prior Publication Data

US 2020/0126620 A1  Apr. 23, 2020

(30) Foreign Application Priority Data

Oct. 1, 2018 (FR) ..................................... 18 59075

(51) Int. Cl.
| | | |
|---|---|---|
| *G11C 11/419* | (2006.01) | |
| *G11C 15/04* | (2006.01) | |
| *H03K 19/20* | (2006.01) | |
| *H03K 19/21* | (2006.01) | |
| *G11C 7/00* | (2006.01) | |

(52) U.S. Cl.
CPC ............... *G11C 15/04* (2013.01); *G11C 7/00* (2013.01); *G11C 11/419* (2013.01); *H03K 19/20* (2013.01); *H03K 19/21* (2013.01); *H03K 19/215* (2013.01)

(58) Field of Classification Search
CPC .. G11C 5/14; G11C 7/067; G11C 7/00; G11C 11/419; H03K 19/20; H03K 19/21; H03K 19/215
See application file for complete search history.

(56) References Cited

U.S. PATENT DOCUMENTS

| 6,552,924 | B1  | 4/2003 | Brooks et al. |
| 6,552,925 | B1* | 4/2003 | Brooks ................. G11C 11/412 365/154 |
| 6,584,002 | B1* | 6/2003 | Brooks ................. G11C 15/04 365/156 |
| 6,744,653 | B1  | 6/2004 | Huang |

(Continued)

FOREIGN PATENT DOCUMENTS

| FR | 3 043 488 A1 | 5/2017 |
| FR | 3 051 960 A1 | 12/2017 |

OTHER PUBLICATIONS

French Preliminary Search Report dated Jun. 28, 2019 in French Application 18 59075 filed on Oct. 1, 2018 (with English Translation of Categories of Cited Documents).

(Continued)

*Primary Examiner* — Jay W. Radke

(74) *Attorney, Agent, or Firm* — Oblon, McClelland, Maier & Neustadt, L.L.P.

(57) ABSTRACT

Memory circuit for implementing logic operations and provided with memory cells, in particular of structure 6T, with a control circuit configured to activate the first access transistors or the second access transistors of at least two cells of the same given column and for detecting from a low- or high-voltage power supply line, from said given column, separate from the bit lines, a signal representative of the result of a logic operation having for operands data stored in said at least two cells.

15 Claims, 4 Drawing Sheets

(56) References Cited

U.S. PATENT DOCUMENTS

| | | | |
|---|---|---|---|
| 9,679,649 B2 | 6/2017 | Gupta et al. | |
| 10,043,581 B2 | 8/2018 | Noel et al. | |
| 2003/0142535 A1* | 7/2003 | Brooks | G11C 11/412 |
| | | | 365/154 |
| 2003/0142536 A1* | 7/2003 | Brooks | G11C 15/00 |
| | | | 365/154 |
| 2006/0262628 A1* | 11/2006 | Nii | G11C 11/412 |
| | | | 365/226 |
| 2008/0122535 A1* | 5/2008 | Chiu | H03F 3/217 |
| | | | 330/251 |
| 2017/0133092 A1 | 5/2017 | Gupta et al. | |

OTHER PUBLICATIONS

Wei-Hao Chen, et al., "A 16Mb Dual-Mode ReRAM Macro with Sub-14ns Computing-In-Memory and Memory Functions Enabled by Self-Write Termination Scheme", IEEE, IEDM 17-657-660,2017, 4 pages.

* cited by examiner

IN MEMORY COMPUTING (IMC) MEMORY CIRCUIT HAVING 6T CELLS

TECHNICAL FIELD AND PRIOR ART

The present application relates to the field of In Memory Computing, i.e. devices that are provided with a memory circuit that is adapted for implementing computing operations.

Conventionally a digital computing device such as for example a microprocessor is provided with an internal memory and with an arithmetic and logic unit (ALU) adapted to the implementing of arithmetic and/or basic logic operations in order to process data contained in the internal memory.

In order to make it possible to increase the speed of certain data processing and/or limit the power consumption related to this processing, memory circuits configured to carry out computing operations, in particular logic operations, have appeared.

Document FR 3 051 960 A1 provides for example a memory circuit with SRAM cells with 10 transistors arranged in lines and in columns, with the cells of the same line sharing 3 word lines, while the cells of the same column are coupled to 4 bit lines. This memory circuit is provided:
- with a control stage to simultaneously activate a pair of cells of the same column,
- with a read stage to read a value representative of a logic operation having for operands data stored in the cells. The read stage is here connected to the bit lines as for a read in conventional SRAM mode.

Document U.S. Pat. No. 6,552,924 B1 presents a memory circuit with cells with 4 transistors and which is adapted to implement logic operations. The reading of a value representative of a logic operation is here carried out using only one of the column or row selection lines. A major disadvantage of this circuit is that the reading, as well as other operations, require unbalancing the memory point by applying different power supply potentials on the two columns or the two rows. Such an imbalance in voltages can easily lead to untimely latching in the state of a memory cell during the activation therefore for reading, and such a circuit thus cannot be used for low-voltage applications.

There is the problem of finding a new memory device that is suitable for carrying out logic operations and that has improvements in terms of consumption and/or size.

DISCLOSURE OF THE INVENTION

According to an aspect, the present application aims to protect a memory circuit adapted to implement computing operations, in particular logic operations, with the memory circuit comprising:
- a plurality of memory cells arranged in lines and in columns the memory circuit being provided:
- with a control stage configured to activate a plurality of cells of the same given column of memory cells,
- with at least one read stage in order to detect, consecutively to said activation and using a low-voltage power supply line from said given column, a representative signal, in particular a representative current or a representative voltage of the result of a logic operation having for operands data stored in storage nodes of said plurality of cells or for operands of data stored in additional data storage nodes of said plurality of cells. The cells can indeed be memory cells provided with 2 storage nodes able to store a piece of logic information and a piece of additional logic information.

In order to detect or obtain the result of a logic operation, a signal coming from a power supply line is therefore read here, in particular the low-voltage power supply line rather than a signal coming from bit lines or from column selection lines. Reading the signal on a power supply line rather than on a bit line or column selection line makes it possible to improve the consumption or at the very least be able to operate the memory circuit at a lower voltage, for example at a voltage that can be less than 1.5 volts.

An embodiment provides for a memory circuit adapted to implement computing operations, in particular of logical operations, the memory circuit comprising:
- a plurality of memory cells arranged in lines and columns of cells, with each memory cell being provided:
  - with a first inverter and with a second inverter cross-connected between a first data storage node and a second additional data storage node, the first inverter and the second inverter being connected between a high-voltage power supply line and a low-voltage power supply line shared by cells of the same column of cells and,
  - with a first access transistor to the first storage node controlled by a first control signal conveyed by a first word line,
  - with a second access transistor to the second storage node controlled by a second control signal conveyed by a second word line,
- the memory circuit further comprising:
  - a control stage configured to activate at least the first access transistors or at least the second access transistors of a plurality of cells of the same given columns of memory cells,
  - a read stage in order to detect, consecutively to said activation and from the low-voltage power supply line from said given column, a signal representative of the result of a logic operation having for operands data stored in said plurality of cells.

Alternatively, it is possible to provide to read a signal coming from the high-voltage power supply line. In this case the read stage is connected to the high-voltage power supply line and configured to detect consecutively to said activation and from the high-voltage power supply line, a signal representative of the result of a logic operation having for operands data stored in said plurality of cells. In this embodiment, here again, the result of a logic operation between cells is not detected on the bit lines, but on a power supply line, which is separate from the bit lines, which allows for more flexibility on the power supply level used and makes it possible to operate in low voltage.

Such a circuit is typically implemented with elementary cells with 6 transistors, which allows it to have a clearly reduced size in particular in relation to a memory circuit provided with 10T cells.

With respect in particular to a memory circuit provided with 10T cells, such a memory circuit can also make it possible to have a reduced number of word lines per horizontal row or line of cells, which in particular allows space to be saved, as well as reduced consumption.

Such a memory circuit advantageously makes it possible to adapt to standard SRAM memory cells or those having a structure that is very close to standard SRAM cell, in particular a standard 6T cell.

Such a memory circuit also makes it possible to adapt to other operating modes and in particular to an operation to carry out CAM reading operations in which a comparison is made between at least one input data word and a data word that is stored by cells of said memory circuit.

Advantageously, the read stage can be provided with a circuit portion in order to convert a current coming from the low-voltage power supply line into a voltage.

Advantageously, the read stage can be provided with at least one comparator, in order to compare a signal (current or voltage) coming from the low-voltage power supply line from said given column and consecutive to said activation, with a threshold of said comparator. Alternatively, the read stage can be provided with a sense amplifier of which the output depends on the level of a signal (current or voltage) coming from the low-voltage power supply line applied as input of said sense amplifier in relation to a threshold of said sense amplifier.

The level of the threshold, referred to as detection threshold can depend on, and be adapted according to the logic operation implemented.

This detection threshold can also be adapted according to a number K of cells of said plurality of cells of said column used during the logic operation implemented.

A particular embodiment provides to use a number of cells K less than the total number N of cells of said column to carry out a logic operation.

According to a particular embodiment for which the representative signal is a current coming from said low-voltage power supply line:
when said current is less than or equal to a minimum value, said logic operation can be of a first type, in particular of the AND type,
and/or when said current reaches a maximum value, said logic operation can be of a second type, in particular of the NOR type,
and/or when said current has a value between said minimum value and said maximum value and is different from said minimum value and from said maximum value, said logic operation said logic operation can be of a third type, in particular of the XOR type.

Reference is made here to basic logic operations AND, NOR, XOR, but it is also possible in the same way to detect or to establish a distinction between an operation of the NAND type, an operation of the OR type and an operation of the XNOR type.

The detection via the read stage typically results in a comparison of said current (or of a voltage resulting from a conversion of said current) with a threshold of a circuit block called comparison block, in particular a comparator or a sense amplifier that belongs to said read stage.

This threshold can depend on, and be adjusted according to the logic operation implemented.

This threshold can also be modulated according to the number K of activated cells in order to carry out a logic operation.

According to a particular embodiment of the memory circuit for which the signal wherein the representative signal is detected from a current $I_{LVS}$ coming from the low-voltage power supply line, and wherein:
when said current $I_{LVS}$ is compared to a so-called "minimum" value, said logic operation is one of the first and second types of operations;
and/or when said current $I_{LVS}$ is compared to a so-called "maximum" value, said logic operation is the other of the first and second types of operations;
the first type of operation corresponding to an AND or NAND operation, and the second type of operation corresponding to a NOR or OR operation;
and/or when said current $I_{LVS}$ has a value between said minimum value and said maximum value while still being different from said minimum value and from said maximum value, said logic operation is of a third type, in particular of the XOR type or of the XNOR, type, the detection by the read stage resulting from at least one comparison between on the one hand said current $I_{LVS}$ or a voltage resulting from a conversion of said current $I_{LVS}$ and on the other hand at least one comparison threshold in current or in voltage of a comparison block of said read stage.

The detection of said representative signal comprises a comparison of a voltage coming from the low-voltage power supply line to a predetermined reference voltage.

It is then possible, according to a particular embodiment, to detect, when the first access transistors are activated, a state that indicates that the first nodes connected to the first activated access transistors are all at the logic level '1' or are all at the logic level '0', or
in such a way as to detect, when the second access transistors are activated, a state that indicates that the second nodes connected to the second activated access transistors are all at the logic level '1' or are all at the logic level '0'.

The predetermined reference voltage can be produced by a programmable circuit block or by a dummy column of cells.

Advantageously, the memory circuit can be provided with at least one dummy column of dummy memory cells connected to a dummy low-voltage power supply line, said read stage further comprising at least one comparator for comparing said representative signal coming from said low-voltage power supply line from said given column to a reference signal coming from the dummy low-voltage power supply line connected to said dummy column.

In this case, when said plurality of cells has K (with K≥2) cells, the control stage is further configured to, during the said activation of the access transistors of said K cells, activate in conjunction K cells of said dummy column.

The read stage can also be provided with an identification block that makes it possible to identify a logic operation carried out, said identification block being configured to generate at least one indicator signal of a type of logic operation from among a plurality of predetermined logic operations, in particular from among a XOR logic operation (or its complementary XNOR), a NAND logic operation (or its complementary AND), a NOR logic operation (or its complementary OR).

Advantageously, the read stage is provided with at least one sense amplifier, which can be of the type with one input or of the differential type.

According to a possible embodiment of the memory circuit for which said representative signal is a current coming from said low-voltage power supply line, the read stage can further comprise: a circuit portion configured for converting said current into a read voltage, said read voltage being transmitted to a sense amplifier, with this sense amplifier being of the type with one input or being a sense amplifier of the differential type led to compare the read voltage to a reference voltage.

In the second case, the reference voltage can advantageously be produced by a dummy column formed from dummy cells, said reference voltage being produced consecutively to the activation of a cell of said dummy column in conjunction with said activation by said control stage of the first access transistors or of the second access transistors.

According to a possible embodiment, the control stage is configured to, according to a first phase, activate the first access transistors of said plurality of cells then according to a second phase, activate said second access transistors of said plurality of cells, the read stage being configured to, during the first phase, detect a current coming from the low-voltage power supply line and coming from the first respective nodes of said plurality of cells and to, during said second phase, detect a current coming from the low-voltage power supply line and coming from the respective second nodes of said plurality of cells.

Such an activation in two phases is typically obtained by a control in two phases of first word lines connected to said plurality of cells then of second word lines connected to said plurality of cells or of second word lines then of first word lines. This activation or control in two phases makes it possible to establish a precise detection of the logic operation carried out and/or of the result of this operation.

With such a detection in two phases, it is aimed in particular to detect, if all of the first nodes are in the same first logic state '1' or '0', then, should this not be the case, if all of the second nodes are in the same logic state '0' or '1', complementary of the first state. Such a detection in two phases applies very particularly to a detection or identification of more than two different logic operations.

Due to the fact that the state of the first storage node is complementary to that of the second node, an activation of the second word lines WL2 and the detection, from this activation, of a case for example where all of the second nodes F of the activated cells are at '0', is equivalent to a detection that the first nodes T of the activated cells are at '1', with this detection able to follow an activation of the first word lines WL1.

According to a possible embodiment of the memory circuit, the control stage can be configured to, according to a first operating phase, activate said first access transistors to the respective first nodes of said plurality of cells, the read stage then being configured to, during the first phase, when a signal coming from the low-voltage power supply line indicates that the first nodes are all at the same given logic level, for example a logic level '1': produce a first indicator signal of a first type of logic operation, in particular a logic operation of the AND (or NAND) type.

The control stage can also be configured to, according to a second phase consecutive to said first phase, activate said second access transistors to the respective second nodes of said plurality of cells, the read stage being configured to, during the second phase, when a signal coming from the low-voltage power supply line indicates that the second nodes are all at a given logic level, for example a logic level '1': produce a second indicator signal of a second type of logic operator, in particular of the NOR (or OR) type.

The read stage can furthermore be configured to, when neither the first signal nor the second signal was produced at the end of the second phase, produce a third indicator signal of a third type of logic operation, in particular of the XOR (or XNOR) type.

Advantageously, the read stage can be provided with an identification block, the identification block comprising a first lock block able, from an input signal of said identification block, to produce and maintain as output the first indicator signal of a first type of logic operation and a second lock block able, from the input signal of said identification block, to produce and maintain as output the second indicator signal of a second type of logic operator, the control stage being configured to prior to the first phase,
    apply a reset signal to the first block and to the second lock block, then, apply a first activation signal to the first lock block in conjunction to the activation of first access transistors,
    apply a second activation signal to the second lock block in conjunction to the activation of second access transistors.

According to a possible embodiment, the read stage can be provided with a multiplexor to receive a first indicator signal of a first type of logic operation, a second indicator signal of a second type of logic operator, a third indicator signal of a third type of logic operation, and to transmit according to an instruction relative to a selection of a logic operation from among said first type, second type and third type of logic operations, one of said first indicator signal or second indicator signal or third indicator signal.

Advantageously, the read stage can be provided with several comparators so as to implement a comparison of a representative signal of a current coming from the low-voltage power supply line (or from the high-voltage power supply line) with several thresholds.

According to a particular embodiment of the memory circuit, the control stage can be configured to, during the same given phase, activate the first access transistors of said plurality of cells without activating said second access transistors to the respective second nodes of said plurality of cells or activate said second access transistors of said plurality of cells without activating said first access transistors, the detection by the read stage resulting, during said given phase of a first comparison between a representative signal of said current coming from the second power supply line and at least one first threshold of a first comparator and during said same given phase of a second comparison between a representative signal of said current coming from the second power supply line and at least one second threshold of a second comparator.

Such an alternative makes it possible to have access to the results of logic operations of three different types for example AND, NOR and XOR, or NAND, OR and XNOR in a single read cycle, without having necessarily to sequentially activate the first word lines and second word lines.

Thus, according to another aspect, a content addressable memory device is provided that comprises a memory circuit such as defined hereinabove.

BRIEF DESCRIPTION OF THE DRAWINGS

The present invention shall be understood better when reading the description of embodiments given purpose for the purpose of information and in no way limiting, in reference to the accompanying drawings wherein.

Furthermore, in the description hereinafter, terms that depend on the orientation of the device such as for example "vertical", "horizontal", apply by considering that the device is oriented in the manner shown in the figures.

Identical, similar or equivalent portions of the various figures bear the same numerical references so as to facilitate passing from one figure to the other.

DETAILED DISCLOSURE OF PARTICULAR EMBODIMENTS

Figures 1A, 1B:
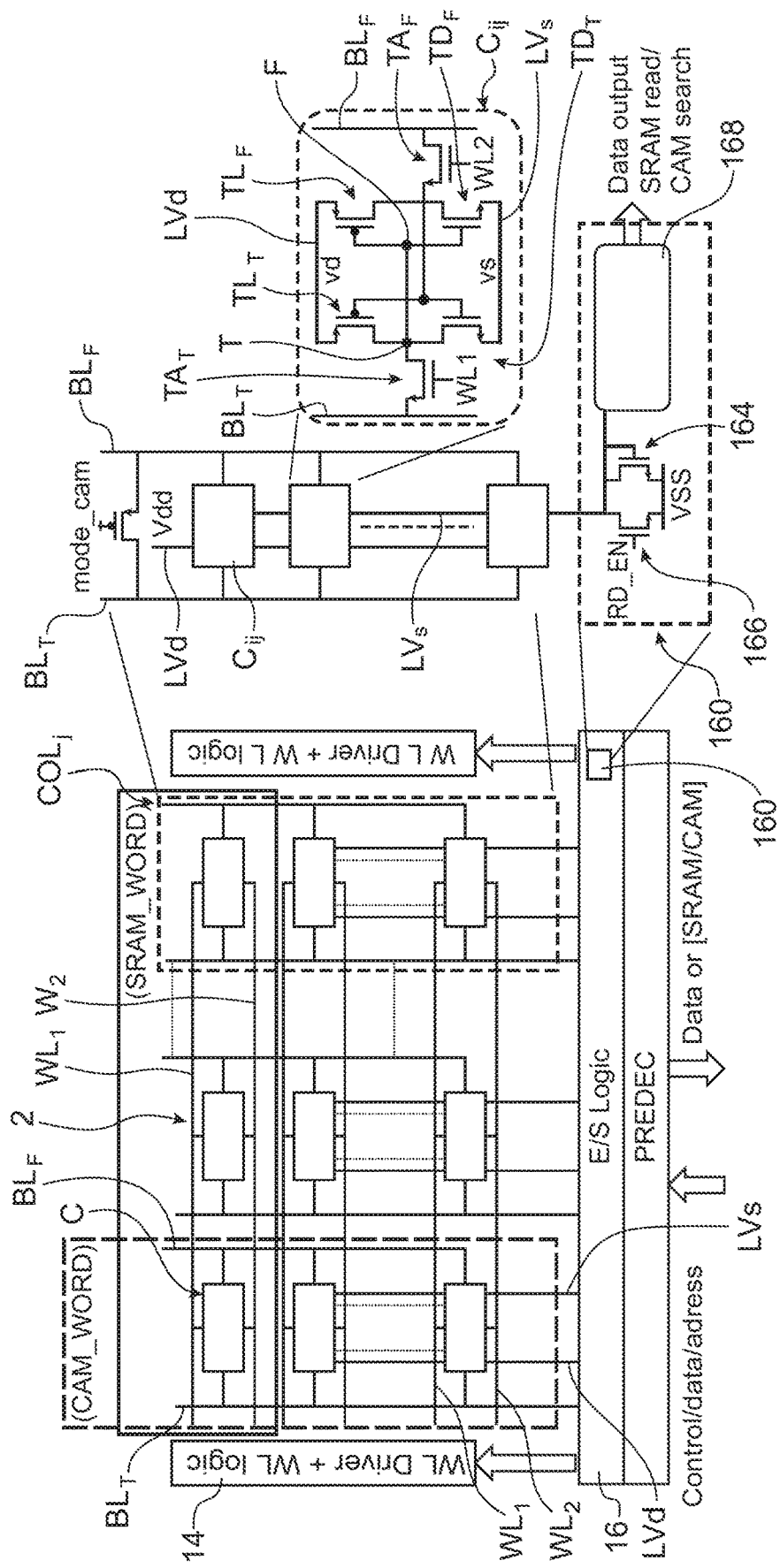
FIGS. 1A-1B are used to show a memory circuit such as implemented according to an embodiment of the present invention, suitable for the implementation of computing operations and in particular of logic operations.

Reference is now made to FIG. 1A, giving an embodiment of a memory circuit provided with a set of elementary memory cells C and adapted not only for storing data but also for carrying out in situ operations, in particular logic operations using data stored in the elementary memory cells C.

The results of these operations can be transmitted to circuits external to the memory circuit or recorded in this memory circuit.

The set of elementary memory cells C is arranged according to an array 2 that comprises a plurality of columns (vertical rows in the example illustrated) of cells and of lines (horizontal rows in the example illustrated) of cells.

In this embodiment, the memory circuit can also be used as a random access memory RAM, in particular SRAM, in which data words SRAM_WORD are in particular read or written formed by, or comprised in lines (here horizontal rows) of elementary memory cells of the array.

The memory circuit can also be used as a content addressable memory (CAM). Each column of cells forms for example a CAM memory word. Such a CAM memory is in particular capable of comparing an input data word with a CAM_WORD data word memorised in a column of elementary memory cells. Typically, a failure information can be returned by the memory circuit each time that a CAM_WORD word in the memory does not concord with the input data word, and a success information each time that a CAM_WORD word in the memory concords with the input data word. The CAM operation and in particular the detection of CAM success or failure can be carried out for example as in document U.S. Pat. No. 9,679,649 B2 coming from the applicant.

The cells of the same column typically have a pair of bit lines $BL_T$, $BL_F$ that are common. In this example, the cells of the same column are also connected to a power supply line LVd referred to as "high", in order to polarise the transistors, this high-voltage power supply line LVd being able to be set to a power supply potential, for example VDD. The cells of the same column are also connected to a power supply line LVs referred to as "low" also called a ground line, able to be set to a potential less than the power supply potential and in particular to a reference potential VSS or of ground GND. The term "connected" is used throughout the description to designate a connection that can be direct or that can be made via the intermediary of one or several other components such as resistors, capacitors or transistors.

The memory circuit here has the particularity of having the cells of the same line of cells having in common two separate word lines WL1 and WL2 and which can be controlled independently of one another and are able to receive separate control signals coming from the control circuit 14. A simultaneous connection of a cell with bit lines BLT, BLF or sequential of this same cell with one bit line then the other can thus be carried out. Such a control of the pairs of word lines WL1, WL2 of each line of the array is carried out using a control stage provided with a control circuit 14 (WL DRIVERS+WL LOGIC) provided with logic circuit elements.

During a CAM operation, the control circuit 14 typically selects all of the word lines WL1 or all the word lines WL2 in order to activate all the cells that comprise a given column of the array.

In a particular operating mode called IMC (for "In Memory Computing"), in order to implement computing operations, and in particular logic operations, in particular logic operations of the NOR type or of the XOR type, or of the AND type, the control circuit 14 is adapted to simultaneously activate in reading, via their word lines WL1 or WL2, a given number K, with K≥2, of elementary cells of the same column of the circuit, in order to carry out a logic operation between these K cells. The control circuit 14 active a given number K≤N with N the number of cells of a column, with certain cells of the column then able to remain inactivated in other words are not the object of read access. Activating two rows of cells can be sufficient to carry out a logic operation, but according to a particularity of the present memory circuit, more than two rows of cells can be activated and therefore more than two cells per column and thus carry out a logic operation using more than two operands. In the operating mode IMC of the present memory circuit it is also possible to activate several rows of cells without necessarily activating an entire column of cells.

The activation or reading of the K cells during a logic operation can be done via a selection of only their respective first word lines WL1 or via a selection only of their respective second word lines WL2 or via a sequential selection of only their word lines WL1, then only of their word lines WL2 or only of their word lines WL2, then only of their word lines WL1.

The result of the logic operation can be read or the detection of a logic operation can be carried out through a read stage 160 that belongs to an input/output circuit 16 (IO LOGIC), the read stage 160 being connected to a power supply line of the column, in this example to the low-voltage power supply line LVs of the column to which the K cells belong.

The detected signal is for example in the form of a current coming from the low-voltage power supply line LVs to which the K cells are connected and which can typically be converted into an input voltage in order to be used for example by a read amplifier. Thus, the reading of the result of a logic operation is done here through the power supply line or lines, the low-voltage power supply lines LVs in this example, rather than by reading a signal coming from the bit lines.

In FIG. 1B, an example of a portion of such a read stage 160 located at the foot of a column COLj of elementary cells is shown.

The read stage 160 is here connected to the low-voltage power supply line LVs shared here by each memory cell of the column COLj.

According to an example, the read stage 160 can be connected to the low-voltage power supply line LVs at the foot of the column COLj, and to the low-voltage power supply VSS by the intermediary of a transistor 164 mounted as a diode, in such a way that the voltage on the low-voltage power supply line LVs can be authorised to increase above VSS during a read operation. For example, the transistor 164 is a NMOS transistor that has its gate connected to its drain. In this example, the low-voltage power supply line LVs is also for example connected to the power supply voltage VSS by the intermediary of a transistor 166, which is for example an NMOS transistor controlled by a read authorisation signal RD_EN. Thus, the low-voltage power supply line LVS is placed at the power supply voltage VSS during the read operations.

The read stage 160 is here provided with the sense amplifier 168 that can be provided to be shared by several or even all of the n columns of the array, which can be carried out by providing an intermediate multiplexor (n-MUX configuration).

Alternatively, it can be provided to associate a sense amplifier per column and to thus provide the read stage with several sense amplifiers 168 (MUX1 configuration). This alternative is particularly suited to a memory circuit in which it is desired to carry out operations of the CAM type. The read stage 160 makes it possible in this example, through transistors 166 and 164, to convert the current into a voltage that can be detected by a detection amplifier block 168 that maintains the low-voltage power supply line LVs at a reference potential for example GND when the memory is not read and makes it possible, during a read, to limit the node connected to low-voltage power supply line LVs to a given potential in such a way as to retain and not disturb the data stored in the cells on which a read access is carried out.

Other structures make it possible to convert the current taken at the foot of the low-voltage power supply line LVs into a voltage that can be considered by those skilled in the art.

FIG. 1B also gives an example of an equivalent electrical diagram of an elementary memory cell $C_{ij}$ of the given column COLj of cells.

This elementary memory cell $C_{ij}$, has a structure similar to that of an SRAM memory, thus provided with two storage nodes T and F, provided to store a first piece of logic information, and a second piece of logic information that is complementary of the first information.

The storing of the logic information in the nodes T, F is provided by transistors $TL_T$, $TL_F$, $TD_T$, $TD_F$ that form inverters that loop on themselves, that is to say are mounted anti-parallel or head-to-tail. Thus, an inverter INV1 is provided with an input connected to the storage node T and to an output of another inverter, with the inverter INV1 furthermore having an output connected to the storage node F and to an input of the other inverter INV2. This other inverter INV2 is therefore provided with an input connected to the storage node F and with an output connected to the storage node T.

In the embodiment shown, the elementary cell $C_{ij}$ has a structure of the type commonly referred to as "6T" and thus comprises 6 transistors, with the two inverters then being carried out by, two charge transistors $TL_T$, $TL_F$ in this example of the PMOS type, and also called "pull up", and two conduction transistors $TD_T$, $TD_F$, in this example of the NMOS type and also called "pull down". The cell $C_{ij}$ is also provided with two access transistors $TA_T$ and $TA_F$. The access transistors $TA_T$ and $TA_F$ are respectively connected to a bit line $BL_T$ and to a line of $BL_F$, with these bit lines being generally shared by the SRAM cells of the given column $COL_j$.

As suggested hereinabove, the access to the storage nodes T and F is controlled by separate word lines WL1, WL2 shared by cells of the same line of cells to which the elementary cell $C_{ij}$ belongs. The access transistor $TA_T$, controlled by a control signal applied on a word line WL1 is provided to allow for access or to block access to the node T. The other access transistor $TA_F$, controlled by a control signal applied on another word line WL2 is provided to allow for access or to block access to the second node F. When the transistors $TA_T$ are controlled in such a way as to respectively allow access to the node T and to the node F, it is said that they are activated.

In the example of cell $C_{ij}$ shown in FIG. 1B, the first inverter and the second inverter, and in particular the load transistors $TL_T$, $TL_F$, are connected to the same high-voltage power supply line LVd, for example set to a potential VDD.

The first inverter and the second inverter, and in particular the conduction transistors $TD_T$, $TD_F$, are also connected to the same low-voltage power supply line LVs, with this low-voltage power supply line LVs being at a potential that is less than the one of the high-voltage power supply line, for example at the reference potential Vss or ground potential GND.

The computing operations and in particular the logic operations that can be implemented within the memory circuit are carried out between cells of the same column of cells and more particularly between storage nodes of the same type T or F.

Thus, for implementing logic operations, in particular logic operations of a first type, in particular OR or NOR, or of a second type, in particular AND or NAND, or of a third type, in particular XOR or XNOR on a column of cells of the array, for example on the given column COLj, the control stage provided with the control circuit 14 of the word lines mentioned hereinabove, can be configured to activate at least the first access transistors $TA_T$ of at least two cells of the given column COLj and in order to detect from the low-voltage power supply line LVs from said given column COLj a signal representative of the result of a logic operation having for operands data stored in the nodes T of at least two cells. This representative signal is typically obtained from a current coming from said low-voltage power supply line LVS.

It is also possible to carry out a logic operation having for operands the states of the respective additional storage nodes F of several cells, the control circuit 14 of the word lines being then configured to activate at least the respective access transistors $TA_F$ of several cells of the given column COLj and to detect from the low-voltage power supply line LVs from said given column COLj a signal representative of the result of a logic operation having for operands data stored in the nodes F of said several cells.

Due to the fact that the states of the storage nodes T and F are complementary, an activation of the second word lines WL2 and the detection, from this activation, of a case for example wherein all of the nodes F of the activated cells are at '0', is equivalent to a detection that the nodes T of the activated cells are at '1', with this detection able to follow an activation of the first word lines WL1.

Consider for example a case wherein a precharging of the bit lines $BL_T$, $BL_F$ is carried out at a power supply voltage that can be Vdd, and wherein a logic operation is carried out using the respective levels stored in the respective nodes T of several given cells of a column COLj of which the first respective word lines WL1 are controlled. The cells are in this example biased in such a way that when a cell stores a logic value '0', a current flows through this cell on the low-voltage power supply line LVs. In other words, the transistor $TL_T$ (shown in FIG. 1B) is conductive which means that the voltage at the node F is greater than that present on the node T, with the voltage at the node F being equal to Vdd and that on the node T being equal to the voltage Vss. In shortened form, those skilled in the art will say that the node F is at level "1" and the node T at level "0"; the value coded by the cell being in this example taken equal to "0" in this case; with the understanding that the value coded by the cell would be "1" if the respective voltages of the nodes F and T were inverted. Thus, in shortened form, it can be said that the value of the cell corresponds to the value of its node T.

Several cases can then be considered:

According to a first case, the current $I_{LVS}$ detected on the low-voltage power supply line LVs remains less than or equal to a minimum value, which indicates that none of the given cells is storing a logic level '0', in other words that all of the nodes T are at level '1'. This first case, with a detection of this current of minimum value by the read circuit 160, corresponds for example to a logic operation AND. Thus, the read circuit will output a value "1" if the current is less than or equal to this minimum value and "0" otherwise. This state of the low-voltage power supply line LVs is able to trigger a flag that identifies such a type of logic operation. According to an alternative embodiment, the read circuit could output a value "0" if the current is less than or equal to this minimum value and "1" otherwise, and the operation carried out would be a NAND operation.

According to a second case, the current $I_{LVS}$ detected on the low-voltage power supply line LVs reaches a maximum value, which indicates that all of the given cells are storing a logic level '0'. This second case, with a detection of this current of maximum value by the read circuit 160, corresponds for example to a NOR logic operation. Thus, the read circuit will output a value "1" if the current is greater than or equal to this maximum value and "0" otherwise. This state of the low-voltage power supply line LVs is able to trigger a flag that identifies such a type of logic operation. According to an alternative embodiment, the read circuit could output a value "0" if the current is greater than or equal to this maximum value and "1" otherwise, and the operation carried out would be an OR operation.

According to a third case, the current $I_{LVS}$ detected on the low-voltage power supply line LVs is such that $I_{LVS}$ is between the minimum value and said maximum value while being different from these values, which indicates that certain of the given cells are storing a logic level '0' while other cells among the given cells are storing a logic level '1'. Thus, after detection by the read circuit that this current is between the minimum and maximum values and is different from the latter, this corresponds for example to a XOR logic operation. Thus, the read circuit will output a value "1" if the current is between the minimum and maximum values and "0" otherwise. This state of the low-voltage power supply line LVs is able to trigger a flag that makes it possible to identify such a type of logic operation. According to an alternative embodiment, the read circuit could output a value "0" if the current is between the minimum and maximum values and "1" otherwise, and the operation carried out would be an XNOR operation.

The table hereinafter is used to summarise the cases exposed hereinabove.

| Conditions | Value on LVs | Cells storing '0' | Logic operation |
|---|---|---|---|
| Minimum current | Minimum | None | AND |
| Intermediate current | Average | Some | XOR |
| Maximum current | Maximal | All | NOR |

In the example that has just been given a distinction is established between three types of basic logical operations AND, NOR, XOR. In the same way, it is possible to establish a distinction between NAND/OR/XNOR operations, in that these operations are complementary of the AND, NOR, XOR operations, and that the detection thereof can be obtained either simply by an inversion of the result of one of the AND, NOR, XOR operations (by also inverting a corresponding flag), or by using a read circuit that is structurally provided to deliver an inverse operation, as described hereinabove.

It is also possible to carry out another logic operation by activation of nodes that are complementary with those that made it possible to obtain the result of one of the AND, NOR operations by detection respectively for example of a minimum current and of a maximum current. For example, if an activation of a set of first word lines associated with a first set of first nodes T, makes it possible to obtain the result or to identify an AND logic operation with for example a read circuit that makes it possible to detect a current of minimum value, a corresponding activation of a set of second word lines associated with a second set of complementary second nodes F, makes it possible to obtain the result or to identify a NOR logic operation, with the same read circuit that makes it possible to detect a current of minimum value. Similarly, if an activation of a set of first word lines associated with a first set of first nodes T, makes it possible to obtain the result or to identify a NOR logic operation with a read circuit that makes it possible to detect a current of maximum value, a corresponding activation of a set of second word lines associated with a second set of second complementary nodes F, makes it possible to obtain the result or to identify an AND logic operation, with the same read circuit that makes it possible to detect a current of maximum value.

Likewise, in the example that has just been described it is provided for example that a logic operation AND is identified, when through the low-voltage power supply line LVs, it is detected that all of the cells are storing the value '1', still be considering that the convention of the value assigned to a cell is that mentioned supra, that a detection of the minimum value is carried out and that the first word lines WL1 are activated. Alternatively, if an inverse convention is used of the value assigned to a cell and that the second word lines WL2 are activated, it can be provided that an AND logic operation be identified, when, through the low-voltage power supply line LVs, a detection of minimum value is carried out and that all of the activated cells storing the value '1' are detected. According to this alternative, detecting that all of the activated cells are storing the value '0', then makes it possible to identify a logic operation NOR.

Figure 2:
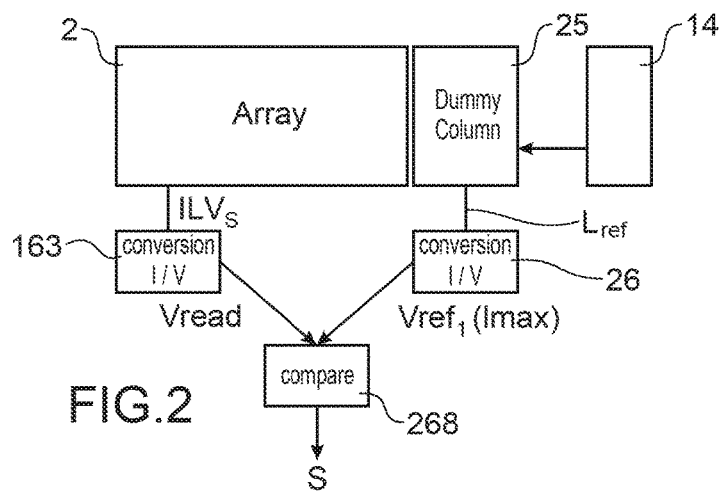
FIG. 2 is used to show a particular embodiment wherein the memory circuit is provided with an array of cells and with at least one dummy column used as a reference in order to establish a comparison with a signal coming from a column of the array.

In order to allow for a precise determination of the result of the logic operation and/or of the type of logic operation carried out, it is possible to provide, as in the example of FIG. 2, to associate the array 2 of elementary cells with a column 25 referred to as a dummy column comprised of dummy memory cells, i.e. that are used as a reference or control cells rather than a means of data storage. The dummy cells of the dummy column 25 make it possible to produce reference electrical signals and are more preferably in a number equal to that of a column of the array.

Typically, the dummy cells can have a structure that is similar to that of the cells of the memory array 2. The dummy cells can be provided with a node connected to a given potential for example of power supply VDD or a ground potential GND in such a way as to force the cell to a given value, and thus obtain a cell on which a write access cannot be carried out but for which a read access is possible. A dummy cell thus makes it possible to read a reference data that remains the same for all of the read accesses.

As the elementary cells of the array, the dummy cells of the dummy column 25 are connected to a dummy low-voltage power supply line or dummy reference line Lref which can be connected to the same potential as the low-voltage power supply line LVS, in particular to VSS or GND and on which is sampled a current that depends typically on the number of activated dummy cells. In order to serve as a reference and deliver a reference current, the dummy cells of the dummy column 25 can be configured in such a way as to store the same given logic level. For example, it can be provided that all of the dummy cells of the dummy column 25 are set to the logic level '0' and that regardless of the activated word line WL1 or WL2 the dummy cell is conductive. The column 25 of dummy cells is typically connected to the same number of word lines WL1 and/or WL2 as a column of elementary cells of the array 2. Thus, advantageously, when the control stage activates access transistors $TA_T$ and/or $TA_F$ of K cells of a given column of the array 2, it activates in conjunction K dummy cells of said dummy column 25. This makes it possible to obtain a reference current that depends on the number of activated cells.

The reference signal, for example in the form of a voltage or of a reference current, coming from the dummy column consecutively to the activation of K cells can be provided in such a way as to have a level that is different from that taken at the foot of the column and consecutive to the activation of the same number K of cells in a column of cells used as operands. Thus, it is possible to carry out a comparison between the reference signal and the signal taken at the foot of the column using their respective low-voltage power supply lines LVs in order to carry out the desired logic operation.

This difference can be adjusted at the time of the designing according to the detection precision required. It is typically provided to be enough to make it possible to differentiate two signals that have the same number of bits in the same state, for example a state '1', except for 1 bit.

Consider for example the case described hereinabove with a precharging to a power supply voltage Vdd, and dummy cells biased in such a way that when a dummy cell stores a logic value '0', a current flows through this cell. Thus, the activated dummy cells deliver a maximum reference current Imax on the line Lref that corresponds to the case where all of the cells are storing a logic level '0'. The reference current Imax is modulated according to the number of operands of the logic operation wherein the number of activated dummy cells in the column 25 corresponds to the number of cells carrying out the logic operation in a given column of the array 2.

In order to be able to compare the signal coming from a given column COLj of the array 2 due to a logic operation between cells of this given column and that delivered by the dummy column 25, it is possible to establish beforehand a current/voltage conversion and provide a stage 163 of the read circuit that makes it possible to convert the current $I_{LVS}$ into a potential Vread as output of the array 2. Likewise, a current/voltage conversion is thus established with a stage 26 that makes it possible to convert the reference current $I_{max}$ into a reference potential Vref1 at the output of the dummy column 25. A comparison of the potential Vread and of the potential Vref1, forming a threshold, is typically carried out using a comparator block 268. The state of an output signal S of the comparator 268 is detected in order to know the result of a logic operation.

In order for the comparator 268 of the read circuit to operate correctly, by comparing the voltages generated by the array 2 and by the dummy column, it is necessary that these voltages that result from currents Is and Iref respectively on the low-voltage power supply line LVs and the dummy low-voltage power supply line Lref differ more preferably by an intermediate value in relation to a case that corresponds to a difference of a single bit between the logic levels of the plurality of cells to which the logic operation is applied. If for n selected cells that store the logic level '0' in the array, the output voltage VX is generated and if for n−1 cells that store the value '0' the voltage VY is produced and VX>VY, the reference voltage $Vref_1$, used as a threshold for the comparison, more preferably satisfies the condition VX>$Vref_1$>VY and the differences VX−$Vref_1$, $Vref_1$−VY are preferably greater than the offset of the comparator 268. The difference between the voltage takes at the foot of an activated column and the reference voltage used as a threshold can be adjusted at the time of the designing of the memory circuit at the level of the stage of current voltage conversion 163 and/or at the level of the dummy column 25, and/or of the stage 26. One thus compares a signal taken at the foot of the column of an activated column with a threshold that can be adapted according to a number K of cells activated in this column in order to carry out a logic operation.

In order to carry out a logic operation with more than two operands and able to require an activation of a number greater than two of rows of elementary memory cells in other words of an activation of a number greater than two of word lines, while still retaining a reliability in the detection of the result of the operation and/or of the type of logic operation carried out and this even when the number of word lines or rows of activated cells is substantial, a particular embodiment provides an operation in two phases and in particular in two separate control cycles of the word lines WL1 then WL2 or WL2 then WL1.

For this particular embodiment, the control stage, and in particular its control circuit 14 of the word lines WL1, WL2 mentioned hereinabove, is configured to, according to a first phase activate the first access transistors $TA_T$ of a plurality of cells in order to detect a current on a low-voltage power supply line LVs coming from storage nodes T of this plurality of cells, then, according to a second phase, activate the second access transistors $TA_F$ of a plurality of cells so as to detect a current on the low-voltage power supply line LVs coming from the respective additional storage nodes F of this same plurality of cells.

Alternatively, the activation in two phases can be such that the control circuit 14 activates, during the first phase, through second word lines WL2 the second access transistors $TA_F$ of the plurality of cells, then during the second phase, activates the first access transistors $TA_T$ of this same plurality of cells.

In particular such an activation in two phases is used in order to reliably identify a type of logic operation carried out, by detecting for example a particular case wherein all of the storage nodes of the cells used as operands are at the same logic level, in particular a logic level '1' leading to a minimum current level on the power supply line LVs.

The detection of a case wherein all of the nodes of the same type are at a logic level '1' can be particularly reliable. Indeed, if there are for example the conditions of precharging and of biasing of the cells such as mentioned hereinabove, the difference in potential between the potential established from the signal detected on the low-voltage power supply line LVs and corresponding to the case wherein all of the activated nodes are at a logic level '1' and the one that corresponds to the case wherein most of the activated nodes are at a logic level '1' except a single node at a logic level '0' is maximal.

An identification of the logic operation in two phases, Φ1, Φ2 can be conducted according to the conditions summarised in the table hereinbelow.

| Phase | criterion | STATE? | Logic operation identified |
|---|---|---|---|
| Φ1 Control of WL1 | check if all at '1' | TRUE FALSE Switch to Φ2 | AND XOR or NOR |
| Φ2 Control of WL2 | check if all at '1' | TRUE FALSE | NOR XOR |

In this example, the activation in two phases can be as follows:

during the first phase Φ1, the control circuit 14 controls the word lines WL1 of a plurality of cells, and the signal coming from the low-voltage power supply line LVs of the column to which this plurality of cells belongs is detected in order to verify if all of the nodes T are for example at a logic level '1'. In this example the AND operation is then carried out (by detecting if the current is of minimum value).

If this is the case, a flag AND_flag indicating an AND logic operation is triggered.

Otherwise, the second phase Φ2 is triggered by controlling (application of a control potential) the word lines WL2 of the plurality of cells, and the signal coming from the low-voltage power supply line LVs of the column to which this plurality of cells belongs is detected in order to verify if all of the nodes F are at a logic level '1'. In this example a NOR operation is then carried out (by detecting if the current is of minimum value).

If this is the case, it is that all of the nodes T containing an additional logic information of the nodes F were at the logic level '0' a flag NOR_flag indicating a NOR logic operation is triggered.

Otherwise, and if none of the flags NOR_flag or NAND_flag have been activated, a flag XOR_flag indicating the XOR logic operation is triggered. The result of the XOR operation can then be provided, it will be "1" if the AND operation gives "0" and the NOR operation gives "0", and inversely.

The operation in two phases described hereinabove thus advantageously makes it possible to detect an operation of the XOR type or its complement XNOR in two separate consecutive cycles, by using the same comparison element seeking a current of minimum value.

It is possible to provide an automatic triggering of a sequence wherein the first phase then the second phase are carried out.

Alternatively, so as to reduce the power consumption of the memory circuit, it can advantageously be provided, that the control stage triggers the second phase Φ2 only when the flag AND_flag indicating an AND logic operation was not activated at the end of the first phase.

A detection of the signal coming from the low-voltage power supply line LVs and verification using this detection of the condition according to which all of the first nodes or all of the second nodes are at a given logic level, in particular a logic level '1' can be implemented using a read stage provided with a sense amplifier.

Figure 3:
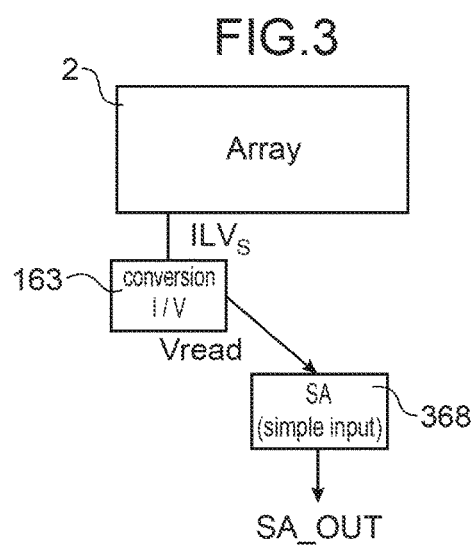
FIGS. 3, 4, 5 are used to show different particular embodiments of a read stage configured to read a signal generated at the foot of a power supply column of the array when a logic operation is carried out between cells of this column.

In the embodiment of a read circuit shown in FIG. 3, a stage 163 that makes it possible to convert the current $I_{LVS}$ sampled on the low-voltage power supply line into a potential Vread, is connected to a sense amplifier 368.

According to a particular embodiment, corresponding to conditions of precharging and of polarising mentioned hereinabove, if the storage nodes to which there is access are all at a logic level '1', the low-voltage power supply line LVs of the column of cells on which the operation is carried out remains at a reference potential Vss or GND while an output signal SA_OUT of the sense amplifier 368 is for example consequently at a logic level '1', indicating that the criterion is satisfied, in other words the storage nodes to which there is access are all at a logic level '1'.

In the case where at least one of the storage nodes to which there is access is at a logic level '0', a current flows on the low-voltage power supply line LVs of the column of cells and modifies the signal Vread, which maintains the output signal SA_OUT of the sense amplifier 368 at the same level, for example at a logic level '0'.

In the case where the difference amplifier comprises several outputs it is possible to use one or the other of the outputs to detect if the aforementioned criterion is satisfied.

Figure 4:
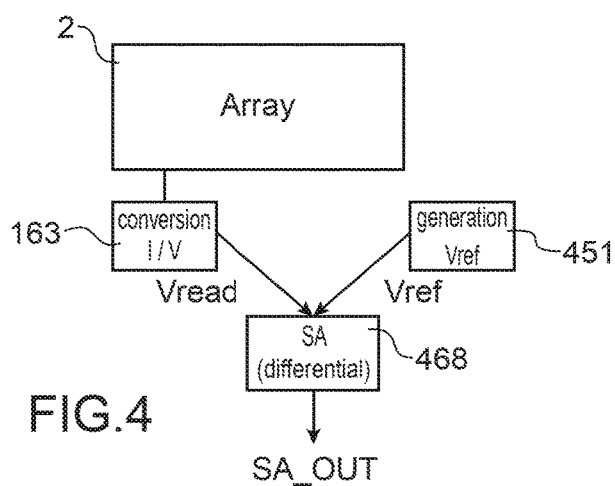

In the embodiment shown in FIG. 4, the read circuit comprises a sense amplifier 468 of the differential type in order to compare the signal Vread with a reference signal Vref forming a threshold.

The threshold or reference signal Vref can be generated by a programmable circuit block 451, in particular with programmable resistors, in order to make it possible to provide the differential sense amplifier 468 a voltage reference value that can possibly depend on the number of activated lines, and can depend on the level of precision required by the designer.

This threshold or reference signal Vref is provided more preferably between a predetermined potential value Vpred1 corresponding for example to a case wherein all of the storage nodes to which there is access are at a given logic level '1' and another predetermined value of potential Vpred2 corresponding for example to a case in which all of the storage nodes to which there is access have a given logic level '1' except a storage node. Such a reference signal Vref makes it possible to carry out a detection of the presence or not of a current of minimum value.

Figure 5:
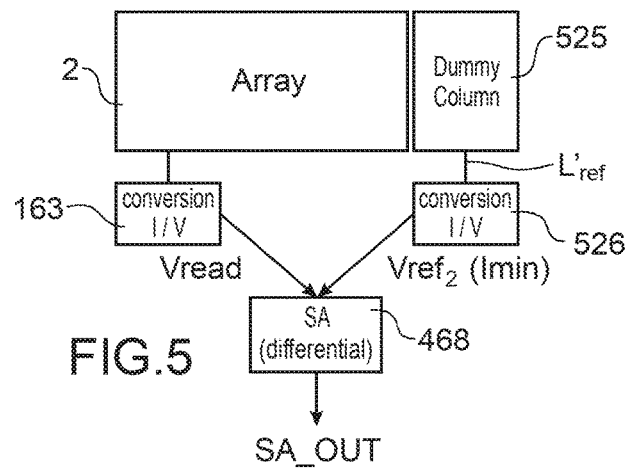

Another embodiment shown in FIG. 5, provides a sense amplifier 468 of the differential type configured to compare the signal Vread that it receives as input to a threshold in the form of a reference signal Vref2 received at another input and generated this time through a dummy column 525 formed of dummy memory cells which are connected to a reference low-voltage power supply line L'ref. In this example, the control circuit is configured to activate only one dummy cell in order to deliver a minimum reference current Imin on the reference low-voltage power supply line $L'_{ref}$. The dummy cells can, as indicated hereinabove, be in the form of conventional 6T cells with a node forced to a given potential for example VDD and which can thus impose on these cells a given logic level for all of the read operations that are carried out on them.

Likewise, a current/voltage conversion with a stage 526 is established which makes it possible to convert the reference current $I_{min}$ into a reference potential Vref2 at the output of the dummy column 525.

So that the comparison carried out by the amplifier 468 makes it possible to differentiate two values of Vread that respectively correspond to a very low current (case where none of the cells conduct current) and a somewhat higher current (case where a single cell conducts current), the reference potential Vref2 generated is between these two values of Vread. Thus, either the conversion stage 526 carries out a conversion that is different from the one carried out by the conversion stage giving Vread, or the current-voltage conversion stages are the same and the dummy cell used is adapted in such a way as to deliver a current that is less than the current delivered by a cell of the array.

In one or the other of these embodiments described hereinabove, the output signal SA_OUT of the sense amplifier 368 or 468 can then be processed in order to identify a given logic operation from among a plurality of determined logic operations, according to a processing process that can be similar to the one with two phases described hereinabove and summarised in the preceding table.

Figure 6:
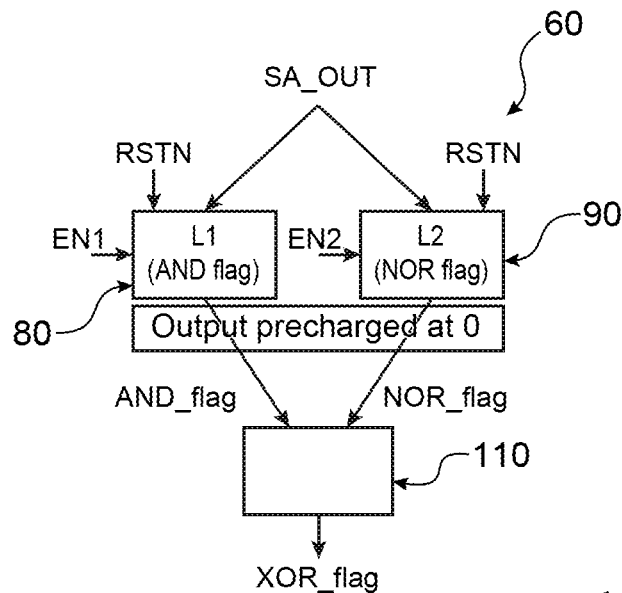
FIG. 6 is used to show an embodiment of a module that makes it possible to generate signals of the flag type that indicate a logic operation carried out cells of the array.

In FIG. 6 an example of a stage 60 for processing, receiving an input the signal SA_OUT generated by the sense amplifier 368 or 468 and able to generate signals AND_flag, NOR_flag, XOR_flag of the flag type that identify logic operations is represented diagrammatically.

In this example, the processing stage 60 comprises a first lock block 80, typically in the form of an asynchronous latch, able to produce and maintain as output a flag AND_flag that indicates a logic operation of the "AND" type, as well as a second bloc 90, which can also be an asynchronous latch able to produce and maintain as output a flag NOR_flag indicating a logic operation of the "NOR" type.

The blocks 60, 80 make it possible to lock their respective flag and to retain it until the processing in one or two phases and such as described hereinabove is completed. The flags AND_flag, NOR_flag here correspond to the output SA_OUT of the differential amplifier.

The reset signal RSTN at the input of the lock blocks 80, 90 makes it possible to reset the respective outputs of these blocks, for example to a given logic level, in this example '0', before the sequence in two phases Φ1, Φ2 starts. The lock blocks 80, 90 are in this example configured to store the output signal SA_OUT consecutively to the reception of an activation signal EN1, EN2, and this, until reception of a new reset signal RSTN. The activation signals EN1, EN2 make it possible to establish a synchronisation and to transmit this output with a delay that is sufficient to allow the amplifier to establish itself at its correct output value.

During the first phase Φ1, in other words the phase during which word lines WL1 make it possible to activate the access transistors $TA_T$ to the nodes T of certain cells used to produce the operands of a logic operation to be identified, the first lock block 80 receives a first activation signal EN1. Once the first activation signal EN1 is received, the output on the first block depends on the signal SA_OUT of the sense amplifier.

During the second phase Φ2, in other words the phase during which word lines WL2 make it possible to activate the access transistors $TA_F$ to the nodes F of said certain cells, the second lock block 90 receives a second activation signal EN2. Once the second activation signal is received, the output on the first block depends on the signal SA_OUT of the sense amplifier.

The signal SA_OUT makes it possible to indicate when said certain cells are not all at the same logic level. If this is the case, both during the first cycle and during the second cycle, the first lock block 80 does not produce a flag AND_flag and the second lock block 90 does not produce a flag NOR_flag, which triggers a production of a flag XOR_flag, through a logic gate 110, for example of the NOR type that receives as input the respective output signals of the lock blocks 80, 90.

According to a possible embodiment, the lock blocks 80, 90 that enable to generate the flags AND_flag, NOR_flag can be carried out as an alternative using synchronous latches.

Consider for example a case wherein the flags AND_flag, NOR_flag and XOR_flag are active in the high state, in other words at a logic level '1'.

The output signal SA_OUT of the amplifier indicates according to its value if at least one node from among the nodes used as operands is at a logic level that is different from that of the other nodes, or if all of the nodes are at the same value. For example by switching to a logic level '0' the signal SA_OUT indicates that at least one node is at a logic level '1'. The outputs of the lock blocks 80, 90 can thus also be at the logic level '0', indicating for example that neither an AND logic operation, nor a NOR logic operation has been detected. The outputs of the lock blocks 80, 90 switch from a level '0' to a level '1' if an AND operation or a NOR operation has been detected.

Figure 7:
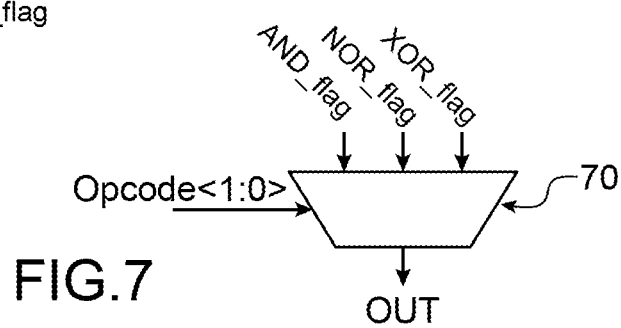
FIG. 7 is used to show an example of a multiplexor that, according to an instruction relative to a given logic operation from among a plurality of predetermined logic operations makes it possible to transmit at the output a signal of the indicator flag type of the type of given logic operation and the result of this logic operation.

The logic gate 110 provided as output can in this case be for example a gate of the OR type that, when its two inputs are at the logic level '0', then indicates as output that a XOR logic operation has been detected and that the result of the XOR logic operation is "1". In the other cases, i.e. if at least one of the registers L1 and L2 is storing a value 1 then the result of the XOR logic operation is "0". It is possible to use the flags AND_flag, NOR_flag, XOR_flag, able to be generated by the stage of processing 60 described hereinabove in order to provide a result of the logic operation carried out. For this, it can be provided as in the embodiment shown in FIG. 7, a multiplexor 70 with 3 inputs AND_flag NOR_flag, XOR_flag. These inputs correspond to the outputs respectively of the first bloc 70, of the second bloc 90 and of the logic gate 110 described hereinabove.

According to an instruction of the opcode type or 'Opcode operation <1:0>', for example with 2 bits that determines a type of logic operation that is desired to be carried out, in particular from among 3 logic operations XOR, NOR, AND, the multiplexor 70 is configured to produce as output OUT a signal that corresponds to one of the three inputs AND_flag, NOR_flag, XOR_flag. The output signal OUT of the multiplexor 70 is thus able to directly give the result of the logic operation. The table hereinabove lists different cases of values of signals of the flag type AND_flag NOR_flag, XOR_flag indicating respectively AND, NOR, XOR logic operations, according to the logic levels stored in the nodes of the various cells, in this example 4, distributed over 4 different lines of the cell array.

|  | Bit 1 | Bit 2 | Bit 3 | Bit 4 |
| --- | --- | --- | --- | --- |
| line 1 | 0 | 0 | 0 | 1 |
| line 2 | 0 | 0 | 1 | 1 |
| line 3 | 0 | 1 | 1 | 1 |

|  | Bit 1 | Bit 2 | Bit 3 | Bit 4 |
| --- | --- | --- | --- | --- |
| line 4 | 0 | 1 | 1 | 1 |
| AND flag | 0 | 0 | 0 | 1 |
| NOR flag | 1 | 0 | 0 | 0 |
| XOR flag | 0 | 1 | 1 | 0 |

Considering that a memory circuit can comprise several read stages such as described hereinabove, it is more preferably implemented blocks 80, 90 for generating compact flags, as in the embodiments of FIGS. 8 and 9.

Figure 8:
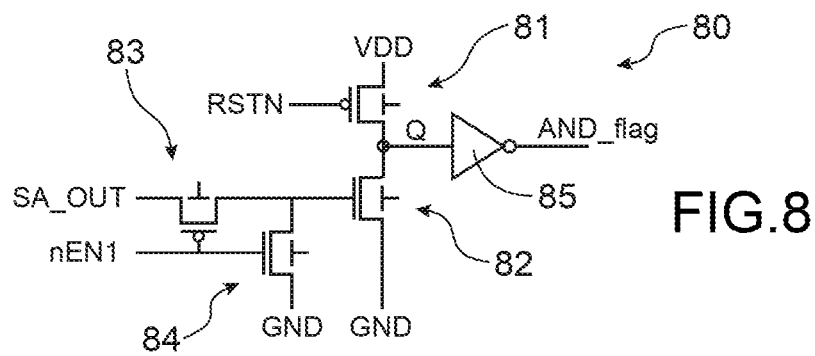
FIG. 8 is used to show a particular example of a stage or block that makes it possible to generate a flag that indicates a logic operation of the AND type.

In FIG. 8, a compact embodiment of the first block 80 able to generate a flag AND_flag indicator of the AND logic operation is given.

This block 80 is provided with transistors 81, 82, 83, 84, and can also be provided, optionally, with an inverter 85 at the output of which the flag can be sampled. Such a block can also be carried out with a latch in particular a latch D.

A precharging of a node Q is controlled by the reset signal RSTN applied on the gate of a transistor 81, for example of the PMOS type. The node Q, arranged here at the input of an inverter 85 can be precharged for example at a logic level '1' which places the output of the inverter 85 at a level '0'. The output signal SA_OUT of the sense amplifier is applied to an electrode of a transistor 83, for example of the PMOS type, of which the gate is controlled by the first activation signal EN1.

The signal SA_OUT takes a given value according to the logic information stored in the cells on which the logic operation is carried out, while during the first phase, the first activation signal EN1, for example active in the low state is triggered to render the transistor 83 on and to allow for the transfer of the signal SA_OUT on the gate of a transistor 82, for example of the NMOS type, of which the source is set to a ground potential GND. A transistor 84 of which the gate is controlled by the first activation signal EN1 is used as a precharge for the gate of the transistor 82, for example of the NMOS type connected to the node Q. When the signal SA_OUT is at a logic level '1', the node Q is discharged to the ground potential GND, which has for effect to set the flag AND_flag to a level '1'.

The adding or not of the inverter 85 depends on the logic level that it is desired to confer to the flag AND_flag so that it indicates that all of the cells used as operands are at the same logic level, in particular at the logic level '1'. In the example shown, the output signal SA_OUT remains at a level '0' when all of the storage nodes to which there is access are at a level '1', which results at the output of the block 80 in a flag AND_flag that remains at the logic level '0'.

Figure 9:
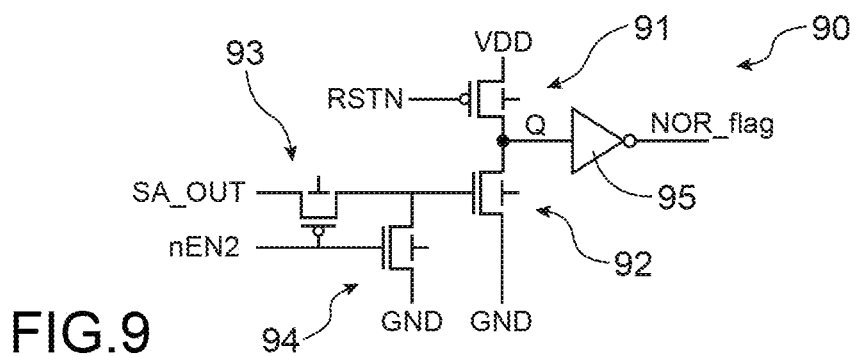
FIG. 9 is used to show a particular example of a stage or block that makes it possible to generate a flag that indicates a logic operation of the NOR type.

In FIG. 9, a compact embodiment of the second block 90 able to generate a flag NOR_flag indicator of the NOR logic operator is shown.

The block 90 that makes it possible to generate the flag NOR_flag can be formed using transistors 91, 92, 93, 94, and optionally, an inverter 95.

The transistors 91, 92, 93, 94 here have an arrangement that is similar to that of the transistors 81, 82, 83, 84 of block 80. The transistor 93 that receives the signal SA_OUT of the sense amplifier is able to transfer or not the signal SA_OUT according to this time a second activation signal EN2 triggered during the second phase Φ2.

In one or the other of the blocks 80, 90 described hereinabove, the transistor 82 (resp. 92) on the gate from which the signal SA_OUT is transferred can be of a type that is different from the one described hereinabove, in particular of the PMOS type, while the reset signal RSTN can be applied to a transistor 81, 91 of the NMOS type, with the node Q then being precharged at a logic level '0'. In such a case, the transistor 84 (resp. 94) that receives the activation signal EN1 (resp. EN2) can also be of a different type, in particular of the PMOS type and connected this time to a potential VDD. The transistor 83 (resp. 93) that receives the output signal SA_OUT of the sense amplifier can also be of a different type and in particular of the NMOS type. In this alternative configuration, when the signal SA_OUT is at the level '0', this drives the setting to a logic level '1' of the flag AND_flag (resp. NOR_flag).

In one or the other of the embodiments of a read stage and of a circuit portion that makes it possible to identify a NOR logic function, an AND logic function, a XOR logic function. It is also possible as an alternative to carry out an identification of the OR function, NAND function and XNOR function, with these three operations being complementary operations respectively of the aforementioned logic operations.

Figure 10:
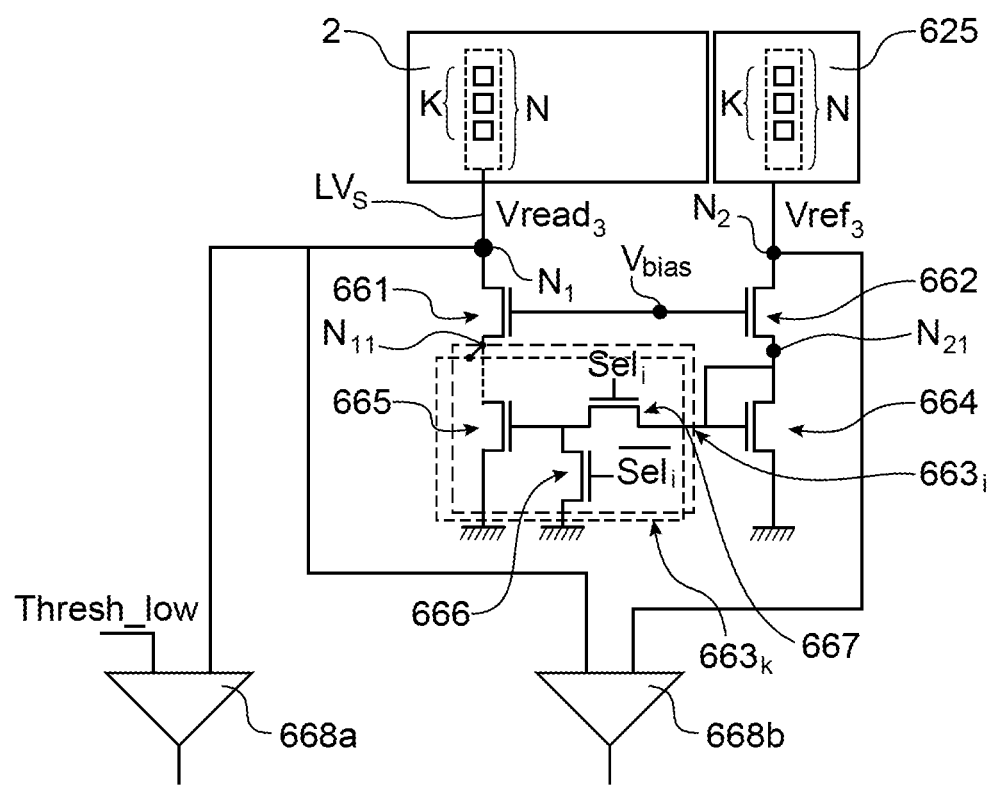
FIG. 10 is used to show a particular embodiment of a particular read stage suitable for the implementing of a comparison between a representative signal of a current coming from the low-voltage power supply line and several thresholds, so as in particular to be able to read the result of logic operations of 3 different types on a single read cycle.

Another particular embodiment of a read stage, for reading the result of IMC operations and in particular of logic operations from a power supply line LVs (in this example the low-voltage power supply line) to which it is coupled is shown in FIG. 10.

This stage has the particularity of implementing two comparison thresholds. This makes it possible in particular to be able to detect three types of logic operations without necessarily implementing an activation of the word lines in two phases such as described hereinabove. Thus, with such a read stage, the implementing of a sequence in which the first word line is activated then the second word line or in which the second word line is activated then the first word line is not necessary in order to be able to detect all of the types of logic operations mentioned hereinabove and in particular being able to detect a logic operation of the XOR or XNOR type.

In this embodiment, a signal Vread3 is, consecutively to the activation of K cells on a column of N cells, taken at the foot of the column at a node $N_1$ connected to the low-voltage power supply line LVs. The signal Vread3 at the foot of the column is in this example taken at the drain of a transistor 661 of which the source is connected to a node $N_{11}$, to which one or several stages $663_k, \ldots 663_i$ of a structure similar to that of the stage $663_i$ shown in FIG. 10 are connected in parallel. The stage $663_i$ comprises a transistor 665 of which the drain is connected to the node $N_{11}$ and the source connected to the ground, as well as transistors 666, 667 that operate as a switch and connected to the gate of the transistor 665 as explained in detail hereinafter. The signal Vread3 can be compared to a first predetermined fixed threshold Thresh_low, applied at the input of a first comparator 668a.

A second comparator 668b and therefore a second comparison threshold are also present. The second comparator 668b makes it possible to carry out a comparison between on the one hand the signal Vread3 that depends on the current at the foot of the column and on the other hand a reference signal $V_{ref3}$, with the latter being taken at a node $N_2$ connected to a dummy column 625, in other words a reference column of cells wherein a number K of cells identical to that used in the column of the array in order to carry out the logic operation is activated. The signal $V_{ref3}$ is in this example taken on the drain of a transistor 662 of which the source is connected, at a node $N_{21}$, to a transistor 664 mounted as a diode, with the source of the transistor 664 being connected to the ground. The gates of transistors 661 and 662 are furthermore connected to a biasing voltage Vbias and form a cascode structure. In each stage, the switch 667 connects the gates of the transistors 665 and 664 and it is controlled by a selection signal $Sel_i$. The switch 666 is placed between the gate of the transistor 665 and the ground and it is controlled by an additional signal of the signal $Sel_i$. Through the selection signals it is possible to select or not a stage, with a stage being selected when the transistor 667 is on (connecting the gates of the transistors 665 and 664 forming a current mirror) and the transistor 666 off.

The comparison to the first threshold Thresh_low, carried out by the first comparator 668a can be provided so as in particular to carry out a detection of a minimum current value by the read circuit. This detection of minimum current, by this first comparator makes it possible to carry out a first logic operation, of a first type AND or NAND or of a second type NOR or OR according to respectively to whether it is the nodes T or F that are activated.

With an "inversing" convention of the read circuit, the output Z of the operation carried out by the first comparator 668a of the read circuit, seeking a minimum current, will take the value "1" as output if the current at the foot of the column is less than a minimum reference current that corresponds to a reference voltage Thresh-low, and will take the the value "0" otherwise. Thus, it is possible to have the following values at the output of the "inverter" comparator 668a (by taking furthermore the aforementioned cell convention, value of the node T=cell value):

if the nodes T are activated:
  if all of the activated cells store a logic value '1', the current at the foot of the column is minimal, Vread3 is less than Thresh_low and Z=1
  if at least one of the activated cells stores a logic value '0', the current at the foot of the column is no longer minimal, Vread3 is greater than Thresh_low and Z=0
In this example a logic operation AND between the values of the operands selected is thus carried out.

if the nodes F are activated:
  if all of the activated cells store a logic value '0', the current at the foot of the column is minimal, Vread3 is less than Thresh_low and Z=1
  If at least one of the activated cells stores a logic value '1', the current at the foot of the column is no longer minimal, Vread3 is greater than Thresh_low and Z=0
In this example a logic operation NOR between the values of the operands selected is thus carried out.

By taking an inverse convention for the first comparator of the read circuit, respectively the NAND and OR operations are carried out, by respectively selecting the nodes T and F.

The second threshold can be used to make it possible to detect a maximum current condition. This detection of maximum current by this second comparator makes it possible to carry out a first logic operation, of a first type AND or NAND or of a second type NOR or OR according to respectively whether it is the nodes T or F which are activated.

With a convention of the "non-inverting" read circuit, the output Z of the operation carried out by the second comparator 668b of the read circuit, seeking a maximum current, will take a value "1" as output if the current at the foot of the column is greater than a maximum reference current that corresponds to a reference voltage Thresh-high, and will take the value "0" otherwise. Thus, it is possible to have the following values as output of the "non-inverting" comparator 668b (by furthermore taking the aforementioned cell convention, value of the node T=cell value):

if the nodes T are activated:
  if all of the activated cells store a logic value '0', the current at the foot of the column is maximal, Vread3 is greater than Thresh_high and Z=1
  if at least one of the activated cells stores a logic value '1', the current at the foot of the column is no longer maximal, Vread3 is less than Thresh_high and Z=0
In this example a logic operation NOR between the values of the operands selected is thus carried out.

if the nodes F are activated:
  if all of the activated cells store a logic value '1', the current at the foot of the column is maximal, Vread3 is greater than Thresh_high and Z=1
  if at least one of the activated cells stores a logic value '0', the current at the foot of the column is no longer maximal, Vread3 is less than Thresh_high and Z=0
In this example a logic operation AND between the values of the operands selected is thus carried out.

With an inverse convention for the second comparator of the read circuit, respectively the OR and NAND operations are carried out, by respectively selecting the nodes T and F. Thus, by using in the same time operation cycle both comparators, it is possible to carry out at the same time two logic operations. Thus, if the first comparator is of the inverting type and the second comparator of the non-inverting type, it is possible, as described above, to simultaneously carry out AND and NOR logic operations by selecting the nodes T, i.e. by activating the word lines WL1 of the selected lines. By selecting the nodes F, by activation of word lines WL2, the operations carried out by the first and second comparators at the same time are respectively NOR and AND operations (which reverts to "inverting" the role of the comparators).

As described hereinabove, according to the result of these two comparisons and of the set of the respective output states of the two comparators 668a, 668b it is possible to detect a condition of current that has an "intermediate" value (see the table mentioned hereinabove) and to deduce therefrom a result of a third type of logic operation, in particular an XOR operation or the complementary thereof, and this, is a single read cycle.

In order to adjust the second comparison threshold in a suitable manner, and make it possible for example for it to detect a maximum current at the foot of the column corresponding to a case where all of the bits stored in the set of K selected cells have the same value (for example all equal to 1) while still excluding a close case wherein at least one of the selected K cells has a different value (e.g. all equal to 1 except one cell), it is possible to adapt at the moment of the designing of the circuit, the respective sizes of the transistors 661, 665, in relation to those of the transistors 662, 664, as well as the offset voltage of the comparator 668b.

It is considered in the two embodiments described hereinafter that there is a single stage 663 and therefore a single transistor 665 for example constantly connected to the transistor 664 (by their gates).

According to an embodiment, transistors 664 and 665 of the same size are provided. Thus, in the case where all of the selected cells are conductive, such as all of the dummy cells, a substantially identical circuit flows in each one of the branches (left branch with the transistors 665 and 661 and right branch with the transistors 664 and 662) and the voltages Vread3 and Vref3 are substantially identical. Thus, in order to be able to correctly detect a maximum current by differentiating the case where all of the cells conduct and the case where all of the cells except one conduct, it is necessary to introduce an offset at the input of the comparator 668b, with this offset being for example taken as equal to half of the voltage difference Vref3 between the 2 cases that it is desired to discriminate.

According to another embodiment, the sizes of the transistors 665 and 664 are not identical and their difference in size makes it possible to introduce a copied current difference, or "current offset" in the current mirror. The comparator 668b can then be without an input offset. Thus, in order to be able to make a distinction between the 2 aforementioned cases (all of the cells equal to '1' or all of the cells minus one equal to '1') it is necessary that the respective sizes of the transistors 664 and 665 are such that the two voltages Vread3 generated in the 2 cases are respectively greater than and less than the voltage Vref3. In practice, the transistor 665 will be a little smaller than the transistor 664 to carry out this condition.

In the examples shown hereinabove, a single transistor 665 is used. In the examples hereinafter, it is provided to use several stages 663 so as to be able to select the number of transistors 665 that are desired to be placed in parallel between the node N11 and the ground. In the case where all of the transistors 665 are activated, the total equivalent size of all of the transistors 665 advantageously corresponds to the size of a single transistor 665 such as used on the assemblies described hereinabove.

According to an embodiment, the stages $663_i$, $663_k$ arranged in parallel and each one connected to the nodes $N_{11}$ make it possible, even after the designing of the circuit and during the use thereof, to displace the second comparison threshold, by adapting the number of activated stages $663_i$, $663_k$. A stage $663_i$ is activated through complementary selection signals $Sel_i$, $\overline{Sel_i}$. In the embodiment shown in FIG. 10, a selection signal $Sel_i$ at the high state ('1') for the stage $663_i$, makes it possible to activate the stage 663i which results in respectively rendering the switch transistor 667 on and the switch transistor 666 off. The respective gates of the transistor 665 and of the transistor 664 mounted as diode are then connected together. When a stage $663_k$, is deactivated, the pair of respective selection signals $Sel_k$, $\overline{Selk}$ of this stage is the inverse of the pair $Sel_i$, $\overline{Sel_i}$, with the respective selection signals $Sel_k$, $\overline{Selk}$ being provided to respectively turn off the switch transistor 667 and turn on the switch transistor 666.

A memory circuit IMC such as in one or the other of the embodiments described hereinabove, in addition to being able to carry out logic operations, can be used to carry out tests on a group of cells of a column and to indicate whether or not the proportion of cells in said column storing the same logic data, for example a logic '1', is greater than at least one predetermined threshold.

Such a test makes it possible for example to know the predominant content ('1' or '0') in a column of memory cells and for example to know if there is more than 25%, or 50% or 75% of '1' content in the column of tested cells. In this case, the reading of the test can also be carried out on one of the power supply lines that is common to the inverters of the cell, for example the low-voltage power supply line. A read stage such as in the example described hereinabove in connection with FIG. 10 is itself particularly adapted to the implementation of such predominance tests of the content in that it allows for a comparison of a current taken at the foot of the column on the power supply line LVs with a comparison threshold that can be adjusted according to the number of stages $663_i$, . . . , $663_k$ activated.

Thus, in the case for example where the transistors 665 number 10, are of the same size, for example equal to about a tenth of the size of the transistor 664, it is possible to carry out a "percentage" test in steps of 10%. By selecting half of the transistors 665, it is tested if the current at the foot of the column, is greater than about half of the current flowing in the dummy cells. Indeed, by having a current mirror that has a ratio 2 between the current coming from the dummy column and the current drawn on the node N1 via the copy, the voltages Vread3 and Vref3 will be about equal when the current at the foot of the selected column is about twice as less as that flowing in the dummy column. Thus, if more than 50% of the cells have a current flowing, then the result of the comparison will be a first value at the output of the comparator 668b and inversely. The operation can be transposed to any current ratio in the current mirror 665/664 defined by the selected number of stages.

Furthermore, according to an embodiment, the activation of a limited number of stages, in particular of a single stage, can possibly be used to carry out a search for minimum current at the foot of the column. This thus constitutes an alternative method for searching for minimum current that does not require a second comparator, or which makes it possible to carry out a redundant operation of seeking minimum current.

In one or the other of the examples that have been described hereinabove, in order to carry out an IMC operation and in particular to carry out a logic operation, the signal coming from the low-voltage power supply line LVs is read. It is also possible to adapt a device described hereinabove to a reading on the high-voltage power supply line LVd and therefore, here again, on a power supply line that is separate from the bit lines $BL_T$, $BL_F$. For this the read stage is this time connected to the high-voltage power supply line LVd. In this case, if the particular case is taken for example of a read stage such as shown in FIG. 1B, it can be provided to replace the transistors 166, 164 of the NMOS type with transistors of the PMOS type that share an electrode set to a power supply potential VDD. Other adaptations concerning the memory array in particular concerning the levels of voltage used that make it possible to activate the cells can then also be provided. For example, instead of pre-charging bit lines at a voltage of Vdd, it is then possible to use a precharge voltage of Vss in order to allow in a complementary manner for a passage of current between a bit line and the power supply potential Vdd through the PMOS transistor of each cell that makes it possible to connect these two points, according to the value memorised by each cell.

The invention claimed is:

1. A memory circuit for implementing logic operations, the memory circuit comprising:
   a plurality of memory cells arranged in rows and columns of memory cells, each column having a first power line and second power line, with each memory cell comprising:
   a first inverter and a second inverter cross-connected between a first data storage node and a second additional data storage node, each of the first inverter and the second inverter being connected between the first power supply line of a given column of memory cells and the second power supply line of the given column of memory cells, the first power supply line and the second power supply line being shared by memory cells of the same given column of memory cells;
   a first access transistor, configured to access the first storage node, being controlled by a first control signal conveyed by a first word line, and being connected to a first bit line; and a second access transistor, configured to access the second storage node, being controlled by a second control signal conveyed by a second word line, and being connected to a second bit line;

a control stage configured to activate at least the first access transistors or at least the second access transistors of a plurality of memory cells of the same given column of memory cells; and at least one read stage configured to detect, consecutive to said activation and from a current or from a potential coming from the second power supply line resulting from said given column of memory cells, a representative signal representative of the result of a logic operation having for operands data stored in said plurality of memory cells of the same given column of memory cells.

2. The memory circuit according to claim 1, wherein the representative signal is detected from a current coming from said second power supply line, and wherein:

when said current is compared to only a minimum value, said logic operation is one of the first and second types of operations;

and/or when said current is compared to only a maximum value, said logic operation is the other of the first and second types of operations;

the first type of operation corresponding to an AND or NAND operation, and the second type of operation corresponding to a NOR or OR operation;

and/or when said current has a value between said minimum value and said maximum value while still being different from said minimum value and from said maximum value, said logic operation is of XOR type or of XNOR type, the detection by the read stage resulting from at least one comparison between on the one hand said current or a voltage resulting from a conversion of said current and on the other hand at least one threshold in current or in voltage of a comparison block of said read stage.

3. The memory circuit according to claim 1, wherein the detection of said representative signal comprises a comparison of a voltage coming from the second power supply line to a predetermined reference voltage, in particular a reference voltage produced by a programmable circuit block or by a dummy column of cells, in such a way as to detect, when the first access transistors are activated, a state that indicates that the first nodes connected to the first activated access transistors are all at the logic level '1' or are all at the logic level '0', or in such a way as to detect, when the second access transistors are activated, a state that indicates that the second nodes connected to the second activated access transistors are all at the logic level '1' or are all at the logic level '0'.

4. The memory according to claim 1, further comprising at least one dummy column of dummy memory cells connected to a dummy power supply line, said read stage further comprising at least one comparator for comparing the current or the potential coming from said second power supply line from said given column to a reference signal coming from the dummy low-voltage line connected to said dummy column.

5. The memory circuit according to claim 4, wherein said plurality of memory cells of the same given column has K (with K>2) cells, the control stage being configured to, during the said activation of the access transistors of said K cells, activate simultaneously in K cells of said dummy column.

6. The memory circuit according to claim 1, wherein the read stage is provided with an identification block and wherein the read stage is configured, in particular by means of a sense amplifier, such as a sense amplifier with one input or of the differential type, to produce, as the input of the identification block, a given signal of which the state depends on a comparison of said current or of a voltage resulting from a conversion of said current to a threshold of a comparison block, in particular a comparator or a sense amplifier that belongs to said read stage, said identification block being configured to, according to the state of said given signal, generate at least one indicator signal of a type of logic operation from among: a XOR logic operation, an AND logic operation, a NOR logic operation, or from among: a OR logic operation, a NAND logic operation, an XNOR logic operation.

7. The memory according to claim 1, wherein said representative signal is detected from a current coming from said second power supply line, the read stage further comprises a circuit portion for converting said current into a read voltage, said read voltage is transmitted to a sense amplifier, the sense amplifier is of the type with one input or the sense amplifier is of the differential type, and the sense amplifier is able to compare the read voltage to a reference voltage.

8. The memory circuit according to claim 7, wherein the sense amplifier is of the differential type, the reference voltage being produced by a dummy column formed from dummy cells, said reference voltage being produced consecutive to an activation by said control stage of a cell of said dummy column.

9. The memory circuit according to claim 1, wherein the control stage is configured to, according to a first phase, activate the first access transistors of said plurality of memory cells of the same given column then, according to a second phase, activate said second access transistors of said plurality of memory cells of the same given column, the read stage being configured to, during the first phase, detect a current coming from the second power supply line and coming from the first respective nodes of said plurality of cells and to during said second phase, detect a current coming from the second power supply line and coming from the respective second nodes of said plurality of cells.

10. The memory circuit according to claim 1, wherein the control stage is configured to, according to a first phase, activate said first access transistors to the respective first nodes of said plurality of memory cells of the same given column, and the read stage is configured to, during the first phase when a signal coming from the second power supply line indicates that the first nodes are all at the same given logic level, produce a first indicator signal of a AND type or a NAND type of logic operation.

11. The memory circuit according to claim 10, wherein the control stage is configured to, according to a second phase consecutive to said first phase, activate said second access transistors to the respective second nodes of said plurality of memory cells of the same given column, and the read stage is configured to, during the second phase when a signal coming from the second power supply line indicates that the second nodes are all at a given logic level, produce a second indicator signal of a NOR type or a OR type of logic operation.

12. The memory circuit according to claim 11, wherein the read stage is further configured to, when neither the first signal nor the second signal has been produced at the end of the second phase, produce a third signal indicator of a XOR type or XNOR type of logic operation.

13. The memory circuit according to claim 12, wherein the read stage is provided with an identification block, the identification block comprising:
- a first lock block configured to, from an input signal of said identification block, produce and maintain as output the first indicator signal of a first type of logic operation;
- a second lock block configured to, from the input signal of said identification block, produce and maintain as output the second indicator signal of a second type of logic operator, wherein the control stage is further configured to, prior to the first phase, apply a reset signal to the first lock block and to the second lock block, then apply a first activation signal to the first lock block in conjunction with the activation of first access transistors, and apply a second activation signal to the second lock block in conjunction with the activation of second access transistors.

14. The memory circuit according to claim 1, wherein the read stage is provided with a multiplexor configured to:
- receive a first indicator signal of a first type of logic operation, a second indicator signal of a second type of logic operator, and a third indicator signal of a third type of logic operation; and
- transmit one of said first indicator signal, second indicator signal, and third indicator signal according to an instruction relative to a selection of a logic operation from among said first type, second type and third type of logic operations.

15. The memory circuit according to claim 1, wherein the control stage is configured to, during a given phase, activate the first access transistors of said plurality of memory cells of the same given column without activating said second access transistors to the respective second nodes of said plurality of memory cells of the same given column or activate said second access transistors of said plurality of memory cells without activating said first access transistors, and the detection by the read stage results from a first comparison, during said given phase, between a signal representing said current coming from the second power supply line and at least one first threshold of a first comparator, and a second comparison, during said given phase, between a signal representing said current coming from the second power supply line and at least one second threshold of a second comparator.

* * * * *